United States Patent [19]

Baldi

[11] Patent Number: 4,694,036

[45] Date of Patent: Sep. 15, 1987

[54] METAL DIFFUSION AND USE

[75] Inventor: Alfonso L. Baldi, Wynnewood, Pa.

[73] Assignee: Alloy Surfaces Company, Inc., Wilmington, Del.

[21] Appl. No.: 507,174

[22] Filed: Jun. 23, 1983

[51] Int. Cl.[4] ............................................. C08K 5/02
[52] U.S. Cl. .................................. 524/473; 524/522; 252/309
[58] Field of Search .................... 419/5, 9, 19, 35, 34; 428/651, 667, 632, 553; 427/253, 259; 524/464, 473, 522; 252/309

[56] References Cited

U.S. PATENT DOCUMENTS

| | | | |
|---|---|---|---|
| 3,554,780 | 1/1971 | Miller | 427/259 |
| 3,893,496 | 8/1975 | Wallace et al. | 411/258 |
| 4,128,522 | 12/1978 | Elam | 427/259 |
| 4,181,758 | 1/1980 | Elam | 427/253 |
| 4,208,453 | 6/1980 | Baldi | 428/632 |
| 4,344,909 | 8/1982 | DeBlauwe | 264/230 |

Primary Examiner—John F. Terapane
Assistant Examiner—Eric Jorgensen
Attorney, Agent, or Firm—Connolly and Hutz

[57] ABSTRACT

Very good masking of pack diffusion aluminizing or chromizing on any metal to keep portions from being diffusion coated, is effected by localized coating the lowest layer of which is depletion-reducing masking powder the metal portion of which can have same composition as substrates, mixed with inert refractory diluent and non-contaminating film-former such as acrylic resin. The upper coating layer can be of non-contaminating particles like nickel or $Cr_2O_3$ that upon aluminizing or chromizing become coherently held together to form a secure sheath. Such sheath can also be used for holding localized diffusion-coating layer in place. Film-former can be dissolved in volatile solvent, preferably methyl chloroform, in which masking powder or sheath-forming powder is suspended. Chromizing can be performed before aluminizing for greater effects. Aluminizing of metals like iron and nickel followed by leaching out much of the diffused-in aluminum, gives these substrates a pyrophoric and catalytic surface. Foil, wire or powder can be thus activated, and very fine activated powder when discharged into the air forms warm cloud that settles very slowly and decoys heat-seeking missiles.

2 Claims, 1 Drawing Figure

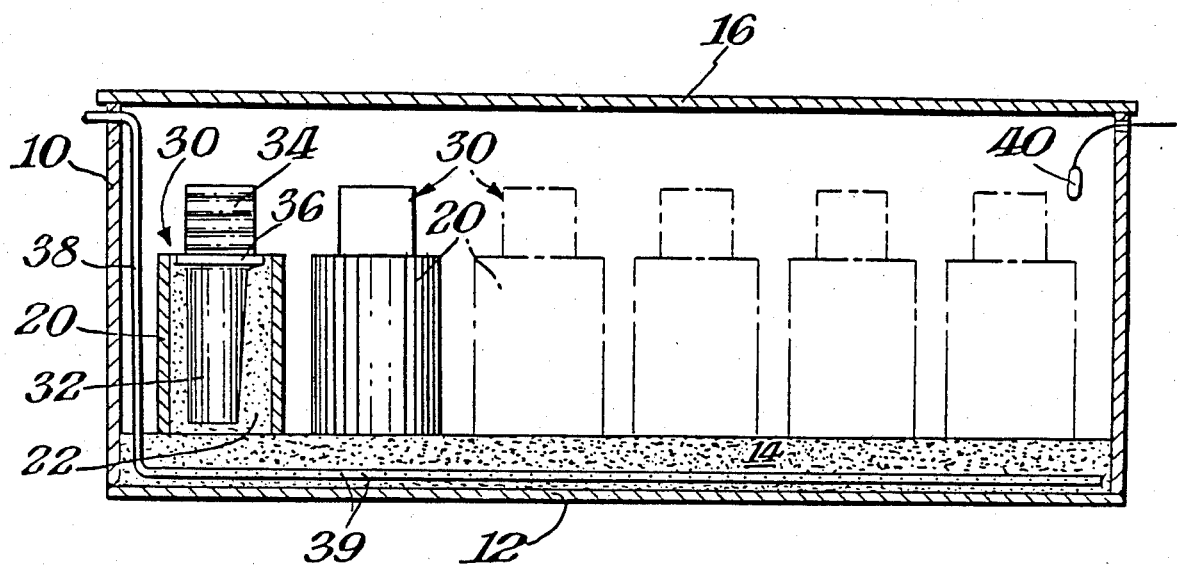

METAL DIFFUSION AND USE

The present application is in part a continuation of:

| Ser. No. | Filed |
|---|---|
| 488,103 | April 25, 1983, now U.S. Pat. No. 4,615,920, granted October 7, 1986 |
| 479,211 | March 28, 1983, now U.S. Pat. No. 4,476,244 |
| 398,830 | July 16, 1982 (U.S. Pat. No. 4,467,016 granted August 21, 1984) |
| 416,353 | June 2, 1982 (subsequently abandoned) |
| 310,085 | October 9, 1981 (U.S. Pat. No. 4,617,202 granted October 14, 1986) |
| 311,621 | October 15, 1981 (subsequently abandoned) |
| 299,789 | September 4, 1981 |
| 281,405 | July 8, 1981 |
| 242,350 | March 10, 1981 (U.S. Pat. No. 4,464,430 granted August 7, 1984) |
| 172,671 | July 28, 1980 (U.S. Pat. No. 4,435,481 granted March 6, 1984) |
| 71,741 | August 30, 1979 (subsequently abandoned) and |
| 851,504 | November 14, 1977 (subsequently abandoned). |

The U.S. Ser. Nos. 398,830, 416,353, 310,085, 311,621, 299,789, 281,405, 242,350 and applications are in turn continuations-in-part of application Ser. No. 238,500 filed Feb. 26, 1981, (U.S. Pat. No. 4,350,719 granted Sept. 21, 1982); while the U.S. Ser. No. 310,085, 311,621, 299,789, 281,405, 242,350 and 172,671 applications are continuations-in-part of application Ser. No. 147,191 filed May 6, 1980 (U.S. Pat. No. 4,327,134 granted Apr. 27, 1982); application Ser. Nos. 292,350 and 172,671 are continuations-in-part of application Ser. No. 89,949 filed Oct. 31, 1979 (subsequently abandoned); application Ser. Nos. 242,350, 172,671 and 71,741 are continuations-in-part of application Ser. No. 963,313 filed Nov. 27, 1978 (subsequently abandoned); application Ser. Nos. 310,085, 311,621, 299,789, 281,405, 242,350, 172,671, 71,741 and 851,504 are continuations-in-part of application Ser. No. 809,189 filed June 23, 1977 (U.S. Pat. No. 4,308,160 granted Dec. 29, 1981); and application Ser. Nos. 71,741 and 851,504 are continuations-in-part of application Ser. No. 752,855 filed Dec. 21, 1986 (U.S. Pat. No. 4,208,453 granted June 17, 1980).

The present invention relates to the coating of metals and the use of the resulting products.

Among the objects of the present invention is the provision of novel coating techniques and compositions for use therewith, as well as novel uses for the coated products.

Additional objects of the present invention include compositions and techniques for confining protective diffusion coatings to desired locations on workpieces such as jet engine components to be protected by the coatings.

The foregoing as well as further objects of the present invention will be more fully understood from the following description of several of its exemplifications.

As pointed out in the earlier applications, diffusion aluminizing of ferrous metals greatly improves their corrosion resistance, particularly when top coatings are applied over the diffusion coating, and particularly for those ferrous surfaces containing at least 1% chromium. In some cases such diffusion aluminizing is best masked off from undesired portions of the surface of the workpiece being coated. Thus where the dimensional accuracy of a workpiece is of a high order, such as on the root of a rotor blade that is to be securely received in a socket, it is frequently impractical to permit aluminizing of that root because the added aluminum increases the root's dimensions. Such masking problems arise more frequently with the superalloy components in the hot section of a turbine engine, where aluminizing and chromizing is widely practiced. Chromizing also increases dimensions.

A particularly desirable masking technique according to the present invention, involves the coating of the portions to be masked with at least one layer of finely divided essentially inert material such as inert dilute, or inert diluent mixed with a small amount, not over about 15%, of a depletion-reducing masking material such as powdered chromium, and applying over that coating at least one stratum of finely divided non-contaminating solid particles that upon subjection to diffusion coating become coherently held together to form a secure masking sheath. To hold the layers in place beforehand, the foregoing solid particles are preferably suspended in a solution of a binder in a volatile solvent, using as a binder a resin that does not interfere with the diffusion coating or the masking, and is preferably driven off essentially completely by the high temperatures of the diffusion coating.

The sheath-forming layer or one or more of the strata which constitute this layer, preferably have $Cr_2O_3$, nickel or mixtures of these two, as the particles that become coherently united by the aluminizing. Neither of these materials contaminate superalloy or stainless steel workpieces inasmuch as only chromium or nickel can be introduced into the workpieces from these sources, and these two metals are already present in the workpieces. Chromium and nickel are also not considered contaminants for low alloy steels, particularly those ferrous alloys containing at least 1% chromium. Even iron and plain carbon steels are not adversely affected by a little chromium or nickel diffused into their surfaces.

The $Cr_2O_3$ and nickel particles, particularly the latter, are so actively effective to make the foregoing sheaths that they can be diluted with as much as twice their weight of alumina or other inert filler, without losing their sheath-forming ability. While they can be used in undiluted form, it is preferred to dilute these ingredients with some filler, at least about half as much filler as active material, by weight. Such dilution diminishes the amount of material than can consume the diffusing metal, and also reduces the masking cost. Moreover undiluted coatings of $Cr_2O_3$ and resin tend to crack on drying.

For best masking of those aluminizing diffusions that are conducted at extremely high temperatures, e.g. 1900° F. or higher, it is helpful to have a three-layer masking combination in which the workpiece-contacting layer is of the depletion-reducing type, the next layer of the $Cr_2O_3$ type, and the outermost layer of the nickel type. The outermost two layers can be mixed together as a single combination layer, if desired. The presence of $Cr_2O_3$ in the outermost layer imparts a characteristic greenish cast to that layer and this helps to visually distinguish the fully prepared workpieces from those which are only coated with the depletion-reducing or lowermost masking layer.

A feature of the present invention is that the masking materials are conveniently marketed as a kit of chemicals. Such a kit can for instance consist of a container holding a quantity of depletion-reducing masking aluminide mixture of U.S. Pat. No. 3,801,357 for example, another container or two holding sheath-forming mixture or mixtures, a further containing holding a solution of the resin in the volatile solvent, and if desired a still further container holding extra solvent. These kits enable very effective masking under all diffusion conditions, even at temperatures as low as 1100° F. or lower. Thus aluminum diffusion into some jet engine compressor parts is conducted at temperatures as low as 900° F., and can be masked in accordance with the present invention.

Turning now to a more detailed description of the present invention, the following is an example.

BRIEF DESCRIPTION OF THE DRAWING

FIG. 1 shows a chromizing pack used by the present invention.

EXAMPLE 1

A number of hot section first stage jet engine blades made of B-1900 nickel-base superalloy had their roots dipped in the following mixture:

| | |
|---|---|
| Powdered $Ni_3Al$ having 20 to 100 micron particle size | 111 g. |
| Powdered chromium having 20 to 100 micron particle size | 3.4 g. |
| Powdered alumina having 20 to 100 micron particle size | 111 g. |
| Poly(ethylmethacrylate) | 9 g. |
| Methyl chloroform | 123 g. |

The resin is first dissolved in the methyl chloroform, and the remaining ingredients then added with stirring to form a uniform suspension that does not settle very rapidly.

A single dip coating treatment with the suspension at room temperature, about 60° to about 80° F., deposits a layer weighing about 130 milligrams per square centimeter after the methyl chloroform solvent is permitted to evaporate. Only a fraction of a minute is needed to complete such a coating, and it is helpful to repeat the dip several times until the combined coatings weight about 500 grams per square centimeter. Dipping a previously dipped coating in the dispersion does not remove any significant portion of the previous coating, particularly if the previous coating had been permitted to dry at room temperature for at least about ½ minute.

After three of more dips as above, the thus-coated blades are dipped in the following coating mixture:

| | |
|---|---|
| Powdered nickel, 20 to 100 micron particle size | 175 g. |
| Powdered alumina, 20 to 100 micron particle size | 175 g. |
| Poly(ethylmethacrylate) | 4.7 g. |
| Methyl chloroform | 62.1 g. |

This dipping is repeated two more times, with intervening dryings at least about ½ minute long each, to build up the latter coating to about 500 milligrams per square centimeter. The blades were then promptly inserted in a pre-fired diffusion aluminizing pack having the following composition in parts by weight.

| | |
|---|---|
| Powdered aluminum, 20 to 60 micron particle size | 10 |
| Powdered chromium, about 10 micron particle size | 40 |
| Powdered alumina, 20 to 60 micron particle size | 50 |
| Powdered $NH_4Cl$ | 0.3 | into which additional $NH_4Cl$ was blended to bring its concentration to the 0.3% value and make up for pre-firing volatilization. All of the blades were completely covered by the pack, and the mass was held in a diffusion coating retort. Diffusion coating was then carried out with a 6 hour hold at 1875° F. in the manner described in U.S. Pat. No. 3,785,854. The blades are then removed from the cooled retort and carry a hard shell-like sheath or crust where the roots have been covered with the masking dips. These crusts are quite adherent and coherent, so that the aluminizing pack is not materially contaminated by the masking layers, and can be reused for additional aluminizing without further precautions.

$Co_3Al$ or $Co_2Al$ or $Fe_3Al$ or any of the other masking aluminides referred to in U.S. Pat. No. 3,801,357 can be used in place of the $Ni_3Al$ in the foregoing example, with somewhat poorer results. Although the cobalt aluminide masking powders give better results with cobalt-based substrates, those results are still not as good as the results obtained from the nickel aluminides.

The crusts are fairly brittle and can be readily removed from the blades by light blows of a hammer or even a wood club, or by blasting with an air-propelled stream of nickel shot. The crust fragments are discarded leaving the blade roots showing no aluminizing, and the balance of the blades with a 3 mil aluminized case.

The shell or crust formation of this example is due to the fact that the nickel powder in the outermost masking layer undergoes so much aluminizing that these powder particles grow together. The dilution of the nickel with as much as four-thirds its weight of inert material such as alumina does not prevent such growing together, and neither is it prevented by the presence of the resin in the dipped masking composition. Such resin is completely driven off during the initial portion of the diffusion coating heat, but the relatively small amount of such resin would not significantly affect the results even if it were to survive the diffusion heat or were carbonized by that heat.

The diluted $Ni_3Al$ in the lower layers of masking does not become aluminized sufficiently to cause shell or crust formation, even though those layers also contain a small amount of chromium that by itself would form a shell. Any metal-containing layer in contact with a workpiece should contain at least 25% inert non-metal such as the alumina, or kaolin, to assure that the metal of the layer does not sinter to the workpiece, and such dilution also keeps the $Ni_3Al$ from forming a shell or crust.

On the other hand, other aluminized powders that are essentially inert to the workpiece but form shells, can be used in place of or in addition to the nickel powder in the shell-forming layers. $Cr_2O_3$ is another such shell-forming material, apparently undergoing some conversion to aluminized metallic chromium. Being less expensive than nickel, $Cr_2O_3$ is particularly desirable for use where masking expenses are to be minimized. Mixtures of nickel and $Cr_2O_3$ can be used with an effectiveness corresponding to that of each individually and indeed a small amount, such as 5% or even 25%, of $Ni_3Al$; can be mixed with the nickel or the $Cr_2O_3$ without detracting significantly from the shell-forming results.

All diluents can be omitted from the shell-forming layers, if desired, but this makes it more important to be sure that at least the minimum effective amount of shell-forming layer is applied. In undiluted condition only about 100 milligrams per square centimeter of nickel or $Cr_2O_3$ is needed, and the presence of the resin adds an insignificant amount to the shell-forming layer needed. Layers deposited from undiluted $Cr_2O_3$ suspended in a resin solution, tend to crack on drying, whereas there is no such cracking when the $Cr_2O_3$ is diluted with at least about $\frac{1}{4}$ its weight of $Al_2O_3$ or other diluent. When inert solid diluent such as alumina, resin or even $Ni_3Al$ is used with nickel powder, such diluent is preferably not over about 50% by weight of the nickel in the sheath-forming layer. The resin content is preferably not over about 4% of the weight of the layer.

The resin in the outer layer acts to keep the masking layers from rubbing off onto or into the diffusion coating pack during the packing. Thus a stratum of nickel powder, with or without alumina, can be applied over the $Ni_3Al$-chromium-resin lower masking layers as by rotating the blades coated with those masking layers in a falling stream of powdered nickel so that falling powder particles adhere to the resin-containing lower masking layers. This is however not nearly as simple as the application of the outer masking layers by dipping, its uniformity is not as good, and some of the falling powder so adhered tends to rub off when the workpiece are handled and when the diffusion coating pack is poured over them.

After the first dip or two to apply resin-containing masking layers, some or all subsequent dips can be effected in resin-free suspensions of the coating materials in a solvent that dissolves the resin in the previously applied layers. Inasmuch as coating suspensions entirely free of resin are more difficult to maintain uniform, a little resin or other viscosity-increasing material can be added to such dispersions to reduce the settling rate of the dispersed powders.

It is also helpful to use a combination of shell-forming masking layers in which some are of the type that depend on the presence of nickel powder, and others are of the type that depend on the presence of $Cr_2O_3$ powder. Thus it is particularly desirable with aluminizings that are effected at about 2000° F. or higher, for the shell-forming combination of layers to have the lowermost shell-forming layer based on $Cr_2O_3$ and built up to at least about 300 milligrams per square centimeter, while the uppermost are based on nickel powder and are also built up to at least about 300 milligrams per square centimeter. It is not desirable for the $Cr_2O_3$ layers to be in contact with the substrate metal.

While other resins and solvents can be used to make the masking layers of the present invention, the acrylic resins are preferred and poly(ethylmethacrylate) is particularly preferred because it gives such good dip coatings and clean products. Methyl chloroform is also a particularly preferred solvent inasmuch as it has the desired solvent action combined with good evaporation characteristics and low use hazard. Some acrylic copolymers are not sufficiently soluble in methyl chloroform, and for such polymers acetone or methyl ethyl ketone or methylene chloride or xylene or toluene or trichlorethylene can be used as the solvent or added to the methyl chloroform. Any other resin that forms a cohesive film can be used, even wax, so long as it does not contribute contamination as by silicon present in silicone resins.

For the masking it is very desirable to have a kit or package of the combination of masking materials. Thus an assembly of three containers can be packaged as a masking kit, one container having the depletion-reducing masking powder mixture of $Ni_3Al$ with chromium and inert diluent, a second container having the non-contaminating sheath-forming mixture, and the third container a solution of non-contaminating film-former in the volatile solvent. This solution preferably has a resin content of not over about 8%, and at least about 2%, by weight.

Where the quantity of film former-solution is so large that this solution can be used over a period of time and can lose substantial amounts of its solvent by evaporation before all of the solution is used, the kit can be expanded to include a fourth container that holds fresh solvent with or without a little of the film-former.

Where two different kinds of sheath-forming mixtures are to be used, an extra container holding the second such mixture is added to the kit. The kit can thus have up to five different containers if no fresh solvent supply is included, or as many as six different containers if such supply is included.

The composition of the depletion-reducing masking mixture can vary in the manner described in U.S. Pat. No. 3,801,357. Thus the aluminide can be nickel or cobalt or iron aluminide containing between $\frac{1}{3}$ and $\frac{3}{4}$ atom of aluminum for every atom of nickel or cobalt or iron, the inert particles can range from about $\frac{1}{4}$ to about $\frac{2}{3}$ or this mixture by weight, and the chromium content can range from about $\frac{1}{4}$ to about 3% of this mixture by weight.

The foregoing masking is very effective to prevent the aluminizing of the masked surfaces. It also serves to mask against chromizing. The following example demonstrates a very effective chromizing combined with a masked aluminizing.

EXAMPLE 2

A batch of first stage PWA 1455 blades for the hot section of a jet engine are cleaned by degreasing in trichloroethylene and then lightly blasting with 220 grit alumina propelled by an air jet at 30 psig. The blades so cleaned are embedded in the following pack, all percentages being by weight

| Powdered chromium | 1.2% |
|---|---|
| Powdered nickel | 2.4% |
| Powdered aluminum | 0.37% |
| Powdered alumina | 96.03% |

All of the powders were minus 325 mesh, their particle sizes ranging from about 20 to about 50 microns, and the mixture well homogenized with repeated siftings, then further mixed with $\frac{1}{2}$% $NH_4Cl$ and $\frac{1}{2}$% $MgCl_2$ and placed in a chromized steel retort before the blades are packed. The packed retort was then covered by an outer retort as described and illustrated in U.S. Pat. No. 3,785,854, care being taken that the outer retort has no leaks and is well sealed. The atmosphere in the outer retort is displaced by a stream of argon introduced through an inlet conduit opening near the bottom of the interior of the outer retort and exited through an outlet conduit opening near the top of the interior of the outer retort. Heating of the retort is initiated and the flow of argon maintained through the entire heat at a rate that assures essentially no entrance of air or moisture into the interior of the retorts. Where the outer retort has no leaks, an argon flow of about 5 standard cubic feet per hour is adequate.

The pack is held at 1900° to 1950° F. for 30 hours after which heating was terminated and the retorts permitted to cool, the argon stream being maintained. The retorts can be opened when the pack temperature cools to about 300° F., the blades unpacked, cleaned with a blast of air, and washed with water.

The blades have a very good chromized case 0.6 to 1.2 mils in depth, with no alphachrome and no objectionable oxide increase seen on metallographic examination.

The foregoing chromizing pack is used without a breakin heat, and has so little metal content that it can be discarded after a single use. If desired, its metal content can be salvaged as by pouring a stream of the used pack through a horizontally moving air stream which deflects away the lighter particles, permitting the metal particles to be collected.

The pack of Example 2 can be modified by incorporating in it about 0.1% magnesium. Chromized cases produced by a pack so modified have even less undesirable oxide visible on metallographic examination, and are of particularly high quality.

In general the pack of Example 2 can have a chromium content of from about 0.6 to about 2%, a nickel content from about ½ to about 3 times the chromium content, and an aluminum content about 1/10 to about ⅓ the chromium content. The argon atmosphere of that example can be replaced in whole or in part by helium, neon or other inert gas or mixture thereof. Other inert diluents like kaolin can be substituted for the alumina in its pack.

The used diffusion coating packs of Example 2 contain a small amount of nickel-aluminum-chromium alloy and can be utilized as masking mixtures in low-temperature aluminizing, that is aluminizing conducted at not over about 1400° F. Thus the used pack can be mixed with 1/5 its weight of a 6% solution of poly(ethylacrylate) and the mixture applied by dipping over the roots of the blades chromized in Example 1, to build up a coating weighing 500 milligrams per square centimeter. The masked blades are then embedded in the following powder pack, the percentages being by weight:

| Alumina | 85% |
|---|---|
| Aluminum-silicon alloy (88%) Al) | 15% | to which is added ½% NH4Cl.

A coating heat in hydrogen with a 30 minute hold at 1350° F. deposits a 10 milligram per square centimeter coating over all unmasked surfaces. The blades are then removed from the pack, the masking mixture brushed off, and then heated in hydrogen having a minus 35° F. dew point for 4 hours at 1975° F. to diffuse the aluminum coatings into the surfaces. They are then rapidly air cooled to below 1000° F., aged for 10 hours at 1600° to 1650° F., and again rapidly air cooled to give blades ready for use with roots only chromized and with their airfoil surfaces chromized and then aluminized.

The most elaborate masking arrangement of the present invention uses a three-layer masking combination in which the workpiece-containing layer is of the essentially inert type, the next layer of the depletion-preventing type, and the outermost layer of the sheath-forming type. Nickel aluminides present in any masking layer other than a sheath-forming layer, should have no more than about 3 atoms of aluminum for every four atoms of nickle.

To make the masking layers easier to apply, it is helpful to add to the resin solution a little long-chain-hydrocarbon acid such as stearic acid that helps keep the particles of the masking composition dispersed in the volatilizable organic solvent in which they are suspended. As little as about 0.1% of such dispersing aid based on the total weight of the suspension, is enough to impart very good flowability so that the painting, or even dipping of the workpiece, is simpler and produces a more uniform masking layer. However dispersing aid concentrations of at least about 0.3% to about 0.5% are preferred, and as much as 1% can be effectively used.

Hydrocarbon chain lengths as short as 12 carbons and as long as 50 carbons or more are suitable for the dispersing aid. Thus lauric acid, myristic acid, oleic acid, and even copolymers of ethylene and acrylic acid, are effective. The dispersing aid should also be soluble in the solvent in which the masking composition is suspended, and hydrocarbon type solvents including halogenated hydrocarbons give best results.

The effectiveness of the dispersing aid is increased by also dissolving in the suspension a small amount of a surface-active agent, preferably a low-foaming nonionic surface-active agent such as polyethoxy ether of a linear primary alcohol like cetyl alcohol, or of an alkyl phenol. Only about 0.1% of surface-active agent is all that is needed. It should be noted in this connection that the surface-active agent when added without the long-chain-hydrocarbon acid, has substantially no effect on the masking suspension.

The masking compositions of the present invention can be used to prevent chromizing or to prevent aluminizing. The nickel and/or nickel aluminide in the masking layers combines with either chromium or both and in this way prevents significant pentration of either of these metals to the workpiece surface on which the masking is applied.

The essentially inert layer of the masking combination need only weigh about ⅛ gram per square centimeter to improve the masking action by preventing roughening of the workpiece surface being masked. That layer can also weigh as much as about 2 grams per square centimeter, and can be composed of inert materials such as alumina, kaolin or MgO. The presence of about ½ to about 5% chromium metal in the essentially inert layer or in the layer above it, contributes a strong depletion-reducing effect.

The following illustrates a more elaborate masking technique.

EXAMPLE 3

A group of hot section turbine engine blades of U-520 alloy (0.05% C, 19% Cr, 12% Co, 6% Mo, 1% W, 3% Ti, 2% Al, 0.005% B, the balance Ni) have their roots masked by dipped coating of three superimposed layers as follows:
  first layer—a slurry of 2300 grams of 10 to 20 micron particles of alumina in 1300 grams (1000 cc) of a 7% solution of poly(ethylmethacrylate) in methyl chloroform containing 0.5% stearic acid. Three dips are used to provide a layer containing about 350 milligrams of non-volatiles per square centimeter of surface, and the layer is then permitted to dry by exposure to the atmosphere for about 20 seconds.

second layer—a slurry of 20 to 50 micron particles of Ni₃Al, similarly sized particles of Cr and 10 to 20 micron particles of alumina in the foregoing methyl chloroform solution of resin and stearic acid. The slurry contains 50 grams Ni₃Al, 5 grams Cr and 45 grams alumina for every 50 cc. of the foregoing solution, and two dips are used to provide about 400 milligrams of non-volatiles per square centimeter of surface. This layer is then permitted to dry.

third layer—a slurry of 20 to 50 micron particles of Ni, similarly sized particles of Ni₃Al and 10 to 20 micron particles of alumina, suspended in the foregoing methyl chloroform solution of resin and stearic acid. The slurry contains 75 grams Ni, 13 grams Ni₃Al and 12 grams Al₂O₃ for every 33 cc. of the foregoing solution, and is brushed on to deposit a layer thickness containing about 600 milligrams of non-volatiles per square centimeter of surface. The resulting layer is also permitted to dry.

The slurries are shaken before dipping and before the brushes used for brushing are dipped into them. A little shaking keeps the slurries well dispersed for the few minutes needed to do the dipping or brushing, and each brush stroke applies a uniform slurry stratum that can be built up to the desired total layer thickness by an overlying brush stroke or two. Expert brush manipulation is not necessary.

The blades with the dried three-layer masking on their roots are then diffusion aluminized, and even at aluminizing temperatures as low as 1700° F. such combination forms the hard shell that remains in place and keeps the masking from significantly contaminating the surrounding diffusion-coating pack. The masking is in the form of a hard crack-free shell locked around each blade root. Striking this shell with a wooden mallet or rod breaks the shell into small pieces that do not adhere to the workpiece, and drop of revealing a smooth bright root surface free of diffusion coating. The balance of the blade shows a good diffusion case 4 mils deep.

Such hard shell protection is also formed when the first of the three masking layers, that is the essentially inert layer, is omitted, but the masked workpiece surface is then apt to be not quite as smooth and bright, particularly when the diffusion coating is effected at very high temperatures. With or without the essentially inert layer, at least about 50 milligrams of Ni₃Al or similar nickel aluminide per square centimeter of masked surface assures the most effective masking, and this can be applied with or without the metallic chromium, and with or without the alumina or other inert diluent in the masking layer. When used without the chromium and without the foregoing first layer, some loss of chromium takes place from masked superalloy surfaces. Without is inert diluent the masking layer becomes more expensive unless its thickness is reduced so that more care is needed to assure its proper application.

In general, a slurry used to apply a masking layer should have at least about 20 volume percent and up to about 70 volume percent suspended solids.

Some superalloys are adversely affected by slurry type masking layers when diffusion chromized at high temperatures for long times. Thus the masking combination of Example 3 will tend to cause intergranular attack of the U-520 during a chromizing heat and this tendency can be reduced by conducting the chromizing at temperatures below 1900° F.

For diffusion aluminizing at temperatures below about 1100° F. or diffusion chromizing at temperatures below 1800° F., masking is very effectively provided without the first layer and despite this omission does not cause significant roughening of the masked surface. When masking workpiece surfaces of cobalt or cobalt-base alloys, cobalt aluminides can be used in place of nickel aluminides. However the foregoing three-layer or two-layer masking is also effective when diffusion chromizing plain carbon and low alloy steels.

In general, the masking layer should contain powdered nickel or powdered nickel aluminide or powdered cobalt aluminide, preferably diluted so that it constitutes up to about 90% of the layer, and at least about 25% of the layer, by weight. However, for masking superalloys, where depletion is to be avoided, elemental nickel should not be used in a layer contacting the masked surface or having only an essentially inert layer between it and the masked surface. In such use the masking ingredient should be a nickel or cobalt aluminide having between $\frac{1}{3}$ and $\frac{3}{4}$ atom of aluminum for every atom of nickel or cobalt.

Similarly a sheath-forming layer can have a nickel or Cr₂O₃ content of from about 50 to about 100%, and when it contains nickel can also contain aluminum in an amount up to equiatomic with the nickel.

The foregoing percentages do not take into account the resin bonding agent and the like that holds the layers in place but is driven off during the diffusion coating.

The second of the masking layers of Example 3 can be omitted and only the first and third layers used when masking against aluminizing and particularly when aluminizing stainless or low alloy steels.

The sheath-forming layer can be used as a very effective mask without any other helping layers, when aluminizing at temperatures below 1100° F. Sheath formation seems to be caused by the sintering together of the nickel particles in the third masking layer, under the influence of the diffusion atmosphere which causes diffusing metal to diffuse into the nickel of these particles. These particles thus grow in size. The Cr₂O₃ particles appear to form some chromium metal that becomes aluminized and sinters to a sheath.

Sheath formation can also be effected by adding to the sheath-forming layer a metal powder like aluminum the particles of which sinter to the nickel particles. Excessive addition is to be avoided to keep the added metal from contaminating the workpiece. Thus an aluminum addition of this type should contribute no more than about one atom of aluminum for every atom of nickel. As little as one-hundredth of that proportion of aluminum helps the sheath formation, particularly where only a light diffusion is being performed.

The sheath-forming layer can be used to lock masking mixtures about a workpiece surface by partially or completely enveloping that surface. However such sheath formation will also securely hold a masking mixture against a portion of a flat or concave workpiece surface, particularly when such a combination is embedded in a powder pack in a diffusion coating retort.

Other inert diluents such as kaolin or MgO can be substituted for some or all the alumina in each of the foregoing formulations.

As noted, it is convenient to have a kit of masking materials for selective use as needed. Another such general utility kit contains separately packaged the inorganic ingredients or ingredient mixtures of the three masking layers of Example 3, along with a separate quantity of the methyl chloroform solution and a separate quantity of methyl chloroform makeup to replenish slurries that have lost excessive solvent through evaporation. The appropriate inorganic ingredients can then be selected and added to the methyl chloroform solution to make any or all of the foregoing layer-forming slurries.

A very desirable kit of this type has
(a) a quantity of diffusion-masking powder,
(b) a quantity of sheath-forming powder, and
(c) a solution of a binder in a volatile organic solvent,
the quantities being so related that the sheath-forming powder is sufficient to form a continuous layer over a continuous layer of the diffusion-masking powder, and the solution forms a workable slurry with both powders.

Such a combination can have for example:
2000 grams of the diffusion-masking mixture of $Ni_3Al$, chromium and aluminum described for the first coating layer of Example 1;
3000 grams of the sheath-forming mixture of Ni, $Ni_3Al$ and alumina described for the third layer of Example 3; and
one liter of the resin solution of Example 3.

For special situations, one or more of the foregoing ingredient units can be omitted from a kit.

The fragments of sheath broken away from the workpiece after the diffusion coating is completed, can contain large quantities of nickel, and such nickel can be recovered from the fragments, if desired, as by dissolving it out in acid and separating the dissolved nickel from dissolved aluminum by ammoniacal precipitation of the aluminum. Alternatively, the fragments can be crushed into powder, their inert diluent such as alumina separated from the crushed powder by dropping that powder through a horizontally moving airstream that deflects the less dense diluent more than the more dense metal, melting the resulting metal with sufficient freshly added aluminum or nickel to convert the melt to $Ni_3Al$ for reuse as such.

Omitting the stearic acid from the slurries used to apply the masking layers makes it more difficult to keep the slurries uniformly suspended and calls for the slurries to be shaken frequently to reduce settling.

Using the first and/or second masking layers without the third layer causes the applied masking layer or layers to develop cracks and gaps during the diffusion heating as a result of the thermal driving off the binder resin. This causes such masking to be unreliable.

Omitting the nickel from the outermost of the three layers keeps it from forming the desired protective shell, unless the omitted nickel is replaced by $CR_2O_3$. The remaining ingredients of the outermost layer make it more generally effective and easier to apply, but are not essential.

Water can be used in place of or in addition to the volatilizable organic solvent in the foregoing slurries but is not preferred, even when used with a water-soluble or water-dispersible binder.

The substitution of other acrylic resins such as poly (ethyl acrylate) or similar binder resins for the poly-(ethyl methacrylate) of Example 3 does not materially change the results. Other solvents such as toluene can also be substituted for the methyl chloroform, but the methyl chloroform has a combination of non-flammability, volatility and lack of health hazard, that makes it particularly desirable.

The outermost or sheath-forming layer of the masking combination makes a very effective retaining or securing means that assures the locking of other types of layers beneath it onto the workpiece surface through the coating heat. The same securing action can be used to hold a slurry coating layer instead of a masking layer, on the workpiece. This is illustrated in the following example and makes it unnecessary to have the workpiece embedded in a coating pack.

EXAMPLE 4

A 5-foot length of steam generator high pressure tubing of Croloy alloy (1.9 to 2.6% Cr, 0.97 to 1.13% Mo, 0.15% C, balance essentially iron) having a ¾ inch bore and a ½ inch wall was thoroughly cleaned inside and out, and had its bore filled with a chromizing pack composed of a previously broken-in mixture of 10% chromium powder the particle sizes of which range from about 10 to about 20 microns, and
90% tabular alumina granules having a particle size ranging from about 100 to about 300 microns to which mixture was added ½% $NH_4Cl$ granules as an activator. The breaking-in was effected by a mixture of the foregoing three ingredients in a retort in the absence of a workpiece, to 1800°-1850° F. for 10 hours under hydrogen. The tube so filled had its ends capped with 1010 steel caps frictionally fitted over the tube ends so as to provide semi-gas-tight covers.

The outside surface of the tube was then painted with the following layers in succession, drying the first layer for a few minutes before applying the second:

first layer—600 grams of a previously broken-in mixture of 45% Cr, 45% alumina and 10% Al, to which ½% $NH_4Cl$ is added before as well as after break-in as described in U.S. Pat. No. 3,801,357, suspended in 200 cc of methyl chloroform solution containing 7 weight percent of a copolymer of 70% ethyl and 30% methyl methacrylates, 0.5 weight percent stearic acid and 0.1 weight percent cetyl ether of decaethoxy ethanol. Four applications of this mixture are made with intervening drying to build the nonvolatile coating to 1200 milligrams per square centimeter of tube surface.

second layer—600 grams of a mixture of 68.5% Ni powder and 31.5% Al powder, dispersed in 150 cc of above methyl chloroform solution. The metals of this slurry were not pre-fired, and only two applications of this slurry was made to provide a non-volatile coating weight of about half that of the first layer.

The tube so prepared was placed in a tubular retort of a diffusion coating furnace assembly having inlet and outlet connections for a hydrogen-blanketing as in U.S. Pat. No. 3,801,357 and then subjected to a diffusion coating heat of 1800° F. for 10 hours. After cool down at the end of the heat, the tube end caps were removed, the pack in the tube bore poured out, and the sheath around the exterior of the tube broken off and removed. The interior of the tube was effectively chromized with a case 1.8 to 2.3 mils thick, and the outside of the tube aluminized with a case about 24 mils thick.

The chromized case included an outer portion about 0.3 mil thick rich in chromium carbide, and an inner portion of columnar chromized structure. This case is particularly effective in reducing erosion of the internal tube surface by rapidly moving high pressure steam.

The aluminized outer surface prolongs the life of the tube in a coal-or oil-fired furnace where it is subjected to combustion atmospheres at temperatures as high as about 1000° F.

The internal pack is a highly fluent composition that is easily poured into place before the heat, and is readily removed afterwards, using a minimum of mechanical poking and the like. Such a pack is particularly desirable for packing of cramped recesses in the interior or workpieces, such as in the narrow bores described above, or in hollow jet engine blades, or the like.

The noted fluency is brought about because the alumina granules, which are crushed from alumina which has been melted and solidified, are quite fluent and show a flow angle of about 45 degrees. This is the angle of incline (measured from the horizontal) of a cone made by pouring a stream of the granules onto one spot to build up a cone. The fluency can be increased by selecting aluminas or other inert particles having an even smaller flow angle. Thus alumina microspheres having particles sized about 100 to about 500 microns are exceptionally fluent. Tabular alumina, which can be made by sintering alumina powder and then crushing, is also fluent, and is preferred because it tamps in place better and then during the diffusion coating does not shrink from the surface against which it is tamped.

The pack need only have about ½ its volume of any of the foregoing fluent materials. Thus the chromium particles by themselves need not be fluent at all, and will provide a suitable fluent pack when ½ of the pack is constituted by the fluent granules or microspheres. Similarly non-fluent alumina or other non-fluent inert material can be present in the pack with or without non-fluent chromium powder, without detracting significantly from the fluency provided by the foregoing volume of fluent material.

Fluent packs are very helpful when the workpiece being coated has a portion of its surface masked to prevent coating there. For such masking the shell-forming masking materials described in application Ser. No. 752,855 are desirable, and the fluent coating pack makes it easier to recover the masked workpiece at the completion of the coating operation with their masking intact. Little or no mechanical working of the fluent pack is needed to remove it from the retort and thus expose the masked workpieces. Thus a used fluent pack is readily removed from the interior of a narrow pipe, for instance, by pushing a narrower tube into the pipe bore and blowing air through the tube as it moves into that bore.

Fluent coating packs also do not require much tamping into place and this reduces the chances of disturbing the masking when the masked workpieces are loaded into a retort at the beginning of a coating operation.

The key feature of the improved masking is the application on the surface portion to be masked, of one or more layers of a masking mixture that inhibits depletion of important alloy ingredients from the substrate as a result of outward diffusion during the diffusion coating heat, and also forms a protective shell to secure the masking in place. The layer or layers are conveniently applied from a dispersion in a volatile solvent in which is dissolved a resin such as an acrylate that is driven off during the diffusion coating heat. The dispersion is very simply applied by brushing, spraying or dipping and the volatile solvent, such as methyl chloroform, permitted to evaporate off for a few seconds to set the solids.

A very effective depletion-preventing slurry is essentially a mixture in the following proportions, of

| | |
|---|---|
| $Ni_3Al$ powder | 40 to 60 grams |
| Cr powder | 4 to 6 grams |
| alumina powder | 40 to 60 grams | in 50 cc of a 5 to 10% by weight solution of poly(ethylmethacrylate) in methyl chloroform. The powders preferably have particle sizes no greater than about 50 microns, and any other inert powder, such as kaolin, can be used in place of the alumina. About 200 milligrams of non-volatiles per square centimeter are applied from a single dip or a single brushing in such a dispersion, and the dips or brushings repeated to build up the non-volatile weight to about 400 milligrams per square centimeter. For low temperature diffusion coating as with aluminum, the chromium content of the solids in the above slurry can be reduced and can be as low as 1% of all the solids.

The grey appearance of the foregoing mixtures as applied to the substrates, are sometimes difficult to visually distinguish on the substrate. Should it be desirable to make them stand out with more contrast, the mixture can be given some different color, as by substituting dark green $Cr_2O_3$ powder for some or all of the alumina. Substituting $Cr_2O_3$ for as little as one-twelfth of the alumina makes a distinct improvement in the distinguishability of the applied powder-resin layer.

Some aluminas are colored reddish and they can also be used for increasing the contrast in the appearance of the powder resin layer. If desired a little dye can be added to the dispersion for the same purpose. Where two or more different types of layers are built up to make a masking combination, each different type of layer can be given a different color to make them more readily distinguishable.

The fluent diffusion coating packs are also highly beneficial for use in chromizing bent small-bore tubing. Thus for some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs.

As pointed out, the shell-forming layer used to hold a slurry coating in place where there is not much of an aluminizing or chromizing atmosphere, contains non-contaminating materials that sinter together under coating conditions. Thus nickel and aluminum powders smaller than about 500 microns in size and in an atom proportion from about 1:0.9 to about 1:1.1 are very effective. Chromium can be substituted for the nickel in such a mixture. Because of the non-contaminating character, a diffusion coating pack will not be ruined in the event a small amount of the masking materials should inadvertently become mixed into it.

Masking of diffusion coatings can also be accomplished in other ways. Thus on ordinary irons and steels as well as low alloy steels, a localized layer of powdered iron appropriately diluted with inert diluent such as alumina, can be applied to reduce or prevent diffusion coating under the layer. This layer can be covered by a sheath-forming layer, but such covering is not needed where the workpieces are not roughly handled during treatment.

Such simple masking can be effected for example on chain saw cutter blades or other cutting edges that are subjected to substantial wear and it is desired to maintain cutting effectiveness notwithstanding the wear. On this basis the cutting edge can be in the form of a narrow edge face on a steel flange, one surface of the flange being very hard and the opposite surface of the flange being relatively soft. The edge face connects those two surfaces and is preferably tapered so that the edge of the harder surface projects out further than the edge of the softer surface, thus providing good cutting action. During use the edge face wears with the softer portion wearing faster than the harder portion so that the cutting effectiveness of the edge face is maintained quite well.

According to the present invention the cutter blades can be made of carbon steel and can be diffusion chromized on one surface to harden it. The opposite surface is masked as by the iron powder layer referred to above, slurrying it in a solution of a resin binder. Such a slurry can be readily applied, with a medicine dropper for example, to the desired surface of a small blade, and after such a coating layer sets the coated blade can be chromized to harden its uncoated surface.

More generally however the cutting edge of such a blade can be diffusion chromized throughout to greatly harden it, particularly if the blade is made of low alloy high-carbon steel. To provide maximum hardening the workpiece can be subjected to carburizing conditions as well as to chromizing, so that the chromium that diffuses into the surfaces of the blade forms a carbide higher in carbon content than $Cr_{23}C_6$.

The carburizing and chromizing can be effected in separate operations, or in a single step. The following example shows a chromizing followed by a carburizing, effected on a low alloy high-carbon steel of the following composition:
0.65% carbon
0.3% manganese
0.75% nickel
0.5% chromium
0.15% molybdenum
balance essentially iron

EXAMPLE 5

These cutters are cleaned and imbedded in a pack made up of a pre-fired mixture of 20% chromium powder and 80% alumina powder, by weight, to which mixture is added ½% ammonium chloride. The pack is held in a retort which is then heated in a hydrogen-bathed atmosphere to 1600°–1650° F. where it is kept for 5 hours. Upon cooling the cutters show a chromized case 0.4 to 0.5 mil thick.

The chromized cutter blades are then carburized in a carbon monoxide atmosphere where they are held at 1550° F. for 2 hours. The resulting blades show a small increase in case depth as well as long life. Other carburizing techniques such as described in the Kirk Othmer Encyclopedia of Chemical Technology, Second Edition, Volume 13, pages 304 through 308 (1967), can also be used with equivalent results.

Both the chromizing and the carburizing can be carried out in the same retort, as for example by suspending the cutter blades in the retort, then introducing a chromizing gas such as described in U.S. Pat. No. 3,222,212, after which such gas is displaced by carbon monoxide or methane or other carburizing atmosphere. The temperature of both treatments can be close to each other, or several hundred degrees apart, as desired. Simultaneous chromizing and carburizing is not very effective.

The weight gain of the blades can be followed to make sure the above-noted high proportion of carbon-to-chromium has been introduced into them. Such proportions give very long-lived cutters, but lower proportions can be used.

If desired the chromizing can be accomplished with a pack that contains a small amount, about 1 to 2% by weight, of metallic magnesium powder. This further improves the durability of the case whether or not it is subsequently carburized. A mixture of iron powder and alumina in which the alumina content is as high as 90% is suitable for masking a modest chromizing. This is illustrated in the following example.

For chromizing at low temperatures, such as 1300° to 1400° F., the masking layer need not contain any inert diluent, but at higher temperatures inert diluent such as alumina or kaolin will keep the iron powder from sintering to the cutters.

EXAMPLE 5

A quantity of chain saw cutters made of the same high carbon steel the composition of which is given above, are prepared by cleaning and then having their under surfaces individually coated with a slurry of a mixture of 80% alumina and 20% iron powder, suspended in a methyl chloroform solution of 2% poly (ethyl methacrylate) and 0.1% stearic acid. The coating weight of the dried coating is about 100 milligrams per square centimeter.

The resulting cutters are embedded in a chromizing mixture corresponding to that used for the internal chromizing in Example 4 but using non-fluent calcined 360 mesh alumina powder in place of the tabular alumina. The diffusion coating pack so made, held in a retort, is subjected to a diffusion coating heat as in Example 4, the pack being held at 1600° F. for five hours.

After cooldown, the retort is opened and the cutters removed and cleaned. A blast of fine glass particles propelled by a stream of air from a 10 psig source removes the masking layer, and the resulting cutters have a 0.4 mil thick chromized case on the unmasked surfaces. The masked surfaces show much less chromizing as well as a greater degree of wear in use.

A fluent pack is not needed for such chromizing, but can be used if desired. Should portions of the masking layers break off during handling and remain in the coating pack, no significant harm is done inasmuch as such an iron-contaminated pack can still be very effectively reused to chromize ferrous surfaces.

To keep from decarburizing carbon away from the carbon steel being chromized, the chromized temperature can be kept from exceeding about 1850° F., and is preferably not over about 1750° F. Cutter blades made of type 416 stainless steel can also be treated in the foregoing manner with corresponding results.

The diffusion coating of nickel or DS nickel with chromium or aluminum can be correspondingly masked by a masking layer of nickel powder, preferably containing about 20 to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

Instead of completely masking off a diffusion coating in selected locations, the diffusion can be arranged to form a thinner case in selected locations, as for example where dimensional tolerance is very tight. This is demonstrated in the following example.

EXAMPLE 7

Hollow first stage PWA 1422 blades for the hot section of a jet engine had their interiors and exteriors cleaned by the degreasing and blasting described in Example 2, and their interiors were then filled with the following powder pack mixture, all percentages being by weight:

| | |
|---|---|
| $Al_2O_3$ | 40% |
| Chromium | 45% |
| Aluminum | 15% | to which ½% $NH_4Cl$ was added. All of the powders had particle sizes between about 20 and about 50 microns, and the mixture had been pre-fired with a previous addition of ½% $NH_4Cl$. The filling of the interiors was assisted by vibration of the blades.

Each blade then had its airfoil end embedded in a batch of the following powder pack mixture held in a short aluminized steel tube closely fitting the airfoil, as described in U.S. Pat. No. 3,824,122:

| | |
|---|---|
| $Al_2O_3$ | 75% |
| Chromium | 15% |
| Aluminum | 8.8% |
| Silicon | 1.2% | to which ½% $NH_4Cl$ is added. This mixture had also been prefired to break it in with a previous addition of ½% $NH_4Cl$.

The collection of blade-holding tubes was then placed in a shallow aluminized retort, with the root of each blade pointing up, and that retort was then filled with the same powder pack used to fill the blade interiors, until all roots were covered by that pack. The retort so packed was then covered with an outer retort and subjected to a coating heat treatment in a hydrogen atmosphere, with the temperature held at 1620° to 1700° F. for 6 to 7 hours. After cooldown the retort is unpacked, the blades removed and cleaned both internally and externally, and then given post heat treatment at 1980°–1990° F. for two hours. The final products showed 1 to 2.5 mil thick aluminized cases in their interiors and on their roots, with a 3 to 4.5 mil aluminized case on their airfoil surfaces. All coatings were of high quality.

The formulation for the two packs of this example can be varied as by a plus or minus departure from the above metal (including silicon) content figures, by an amount about ⅛ each figure. It is preferred however that the chromium-to-aluminum weight in the first pack be betwwen 2.9 and 3.1.

Instead of positioning the airfoils in the closely-fitting individual tubes, the blade roots can be so positioned, and the individual tubes then packed with a masking powder, such as the following mixture:

| | |
|---|---|
| 42.3 | weight % of $Al_2O_3$ |
| 36.9 | weight % of Ni |
| 5.6 | weight % of Al |
| 15.1 | weight % of Cr |

U-520 blades so packed have their airfoil very effectively chromized in the following chromizing pack

| | |
|---|---|
| 45% | chromium powder |
| 23.5% | nickel powder |
| 3.6% | aluminum powder |
| 27.9% | alumina powder |

This mixture is activated with ½% $NH_4Cl$ and broken in by heating to 1950°–1975° F. for 12 hours without a workpiece. The broken in mixture is then finely divided, ½% $NH_4Cl$ added again, and packed in with the blades and subjected to the diffusion-coating heat at 1950°–1975° F. for 10 hours. The masked roots do not pick up any significant coating. Also the masking powders contain sufficient nickel in excess of the aluminum, to grow together and form a weakly coherent mass that does not contaminate the diffusion-coating pack. The chromium content of this masking mixture can be diminished, if desired, to as little as 5%, and such mixtures are very good for masking any superalloy.

The chromized blades with the masked roots are desirably given an aluminized top coating, before or after the masking is removed from the roots. Such aluminizing is preferably of the chromium-inhibited type described in U.S. Pat. No. 3,801,357.

According to another aspect of the present invention nickel-based and cobalt-based superalloys are very easily chromized to form heavily chromized cases that are then made exceptionally free of alphachrome phase. Because of the desirability of cases containing a high chromium content for improving the resistance of such superalloys to corrosion particularly by sulfur-containing atmospheres, several processes have been developed for chromizing these metals. Some of these prior processes are disclosed in the parent applications, and one such process is the gas-phase diffusion coating by heating the superalloy workpiece while it is suspended in a retort the floor of which is covered with a mixture of finely divided chromium particles, inert diluent such as powdered alumina, and an activator such as ammonium chloride.

When it is attempted to provide maximum concentrations of chromium in a diffusion case, some alphachrome phase seems to form no matter what technique is tried to prevent it. The presence of such phase is recognized as undesirable because it imparts excessive brittleness to the diffusion case.

Pursuant to the present invention the chromizing is carried out to the extent that alphachrome is formed, and then the alphachrome is removed by treatment with an aqueous solution of alkali metal permanganate and alkali metal hydroxide. This treatment leaves a dark-colored reaction product which is believed to contain little or none of the removed chromium. The alkaline permanganate solution should be at a temperature of at least about 100° F. to effect alphachrome removal in reasonable periods of time, and the hotter the solution the more rapid and complete is its action. One exemplification of such a process is:

EXAMPLE 8

A cylindrical diffusion coating retort 10 as in the drawing figure, made of plain carbon steel, has its floor 12 covered to a depth of about 1½ inches with a layer 14 composed of, by weight:

20 parts chromium powder 10 to 20 microns in size
80 parts tabular alumina granules 100 to 200 microns in size
¾ part NH$_4$Cl powder These ingredients are mixed together so as to make a layer of fairly uniform composition, and does not have to be pre-fired.

On layer 14 is placed a multiplicity of retaining tubes 20 also of plain carbon steel, each holding a B-1900 superalloy jet engine blade 30 the airfoil portion 32 of which is embedded in a diffusion coating pack 22. Pack 22 is composed of, by weight:

45 parts chromium powder 10 to 20 microns in size
23.5 parts nickel powder 10 to 50 microns in size
3.6 parts aluminum powder 20 to 100 microns in size
27.9 parts fine alumina powder that passes a 325 mesh screen
0.5 part NH$_4$Cl powder The mixture is pre-fired by heating for 10 hours in a plain carbon steel retort at 1900° F. in a hydrogen-bathed atmosphere without a workpiece, the pre-fired pack then crushed to pass a 200 mesh screen and 0.5 part NH$_4$Cl powder is added to it to make up for the NH$_4$Cl driven off by the pre-firing.

To avoid depleting some of the chromium from the pack 22 when it is subjected to the pre-firing, the pre-firing retort can be previously chromized, or can be a high-chromium alloy such as Inconel 600.

For loading tubes 20, the individual blades 30 are first held by fitting their roots 34 in apertures in a supporting table, these apertures being too small to receive blade flange 36. The airfoils 32 are thus pointed upward and a tube 20 is placed over each of them. The pre-prepared pack 22 is then poured into the tube and tamped in place so that it stays there and does not pour when the tube is inverted. The tube should have only a small clearance, about ½ centimeter or less, with respect to the blade flange 36 and support, to keep pack 22 from pouring out the bottom of the tube during the loading and tamping.

The tubes so loaded are then inverted and placed over layer 14 in retort 10, a gas supply tube 38 and thermocouple 40 inserted in the retort with the gas supply tube immersed in powder layer 14, the retort covered by a loosely fitting cover 16 or by placing another retort over its open top, and the assembly subjected to a diffusion coating heat in an outer retort through which hydrogen is passed as described in U.S. Pat. No. 3,764,371, while argon at a slow rate, about 5 standard cubic feet per hour is fed into retort 12 through tube 38 which has many perforations 39. The assembly is brought to 1925° F. and maintained within plus or minus 25 degrees of that temperature for 16 hours, after which it is permitted to cool.

The loaded tubes are removed from the cooled retort and the blades 30 removed from pack 22 after that pack is loosened as by jarring the tube. The roots 34 of the blades now show a case about 0.7 mil thick containing a maximum of about 35% chromium and a very small amount of alphachrome phase. The airfoils 32 on the other hand have a case with two chromium diffused zones. The outer zone is a little over 1 mil thick containing a maximum of about 75% chromium and is essentially alphachrome. The inner zone is essentially gamma nickel containing a maximum of about 35% chromium.

The alphachrome phase is removed from the blade roots by now dipping the roots for about 10 minutes in a 180° F. solution in water of 5% KMnO$_4$ and 5% NaOH, then rinsing and dipping them for a few seconds in 10% HCl in water to remove the film formed by the alkaline permanganate, and the alkaline permanganate dip repeated. The roots now show no alphachrome phase. The entire blade can be so treated, if desired, inasmuch as this treatment has a negligible effect on the heavy alphachrome phase on the airfoils.

The blades are then aluminized by subjecting them to an aluminum diffusion pack treatment at 1925±25° F. for 12 hours in the manner described in U.S. Pat. No. 4,041,196, the roots being kept imbedded in a masking pack in order to keep them from being aluminized. The aluminizing increases the case depth over the airfoil to close to 3 mils maximum, brings up the aluminum content of the case to over about 25%, and breaks up the alphachrome phase into a multiplicity of small islands. As described in U.S. Pat. No. 4,041,196 such a case does not have the undesirable unduly brittle character of a continuous alphachrome phase, and because of its high chromium content is particularly resistant to sulfidation attack. The aluminizing also makes it highly resistant to oxidative attack.

Repeating the chromizing on fresh blades can give a chromized airfoil case with an outer high-chromium-content zone a little over 0.5 mil thick, the blade roots then having their alphachrome content readily removed by a 5 minute dip in the 5% KMnO$_4$-5% NaOH solution at 160° F., followed by a few seconds dip in 18% HCl in water.

The cooling down from the aluminizing step can be effected at a rate rapid enough to subject the vane to the first step of a heat treatment usually followed by an aging step to give nickel-base superalloys their maximum strength as described in U.S. Pat. No. 3,824,122.

The chromizing treatment can if desired also be effected with masking of a blade root or vane buttress, using any of the procedures described above or in Ser. No. 752,855 or U.S. Pat. Nos. 3,801,357 and 3,785,854.

The alkaline permanganate treatment is best applied before the aluminizing step, and can be effected at temperatures as high as the boiling point of the treating solution, in which case a single dip is sometimes adequate to remove all alphachrome if only present in small amounts. This treatment can also be conducted at temperature as low as about 100° F. where a multiplicity of dips is generally needed. At 150° F., two dips are adequate, but three dips are best used when the alkaline permanganate solution is at 130° F.

The acid treatment between the alkaline permanganate dips can be with inhibited or uninhibited acid, preferably the former if the acid treatment is prolonged for more than a few seconds. It can be completely omitted in which event the alkaline permanganate treatments at temperatures of 200° F. or below are extended to ½ hour or longer. Other strong mineral acids like H$_2$SO$_4$, H$_3$PO$_4$, HNO$_3$ and HBr can be used, and the acid concentration is preferably about 5 to 15% by weight. Without an acid after-treatment a film of adherent dark-colored reaction product left on the workpieces by the alkaline permanganate treatment can be removed by other techniques such as sand blasting.

The alkaline permanganate solution can be prepared with any alkali metal hydroxide and should have a pH of at least about 13, although alkalinities as low as 11 can be used by prolonging the dips and/or repeating them more times. The concentration of the permanganate should also be above about 0.1%, but below about 3% strength the dip times need to be lengthened.

Increasing the concentration of the permanganate and/or the alkali, speeds the action somewhat. Like the alkali, the permanganate can be of any alkali metal. The action of the alkali-permanganate bath seems to be that of oxidizing chromium in the alphachrome form, and its effect extends to depths of as much as ½ mil into the case. This is the zone in which alphachrome usually forms.

It is helpful to provide, for the alphachrome removal, a kit made up of a solution of alkali combined with permanganate, and a separate solution of a mineral acid, preferably inhibited hydrochloric acid. Such a kit can be a convenient article of commerce, containing the separate solutions separately bottled in unbreakable plastic bottles. Inasmuch as the volume of each solution determines the amount of material that can be immersed in it, both solutions can have about the same volume. However the mineral acid is available in concentrations that require dilution, whereas the alkali-permanganate solution is conveniently used at a concentration near its maximum, so that to reduce costs the kit can have the acid at a concentration that requires dilution to two or three times its volume before use.

For maximum cost-effectiveness the quantity or permanganate and/or acid can be adjusted so that both solutions become exhausted at about the same time. The rate of permanganate exhaustion is subject to considerably more variation than that of the acid exhaustion, but in general the total weight of permanganate ion can be about one to two times the total weight of anhydrous acid, in the acid solution.

It is also practical to have the alkali and/or the permanganate of the kit in dry or undissolved condition inasmuch as this reduces the total weight and bulk of the kit. The proportion of these two ingredients can then be from about 30:70 to 70:30 by weight. The mineral acid of the kit can be replaced by inhibitor such as rosin amine acetate. Such inhibitor can be present dry or dissolved in a little water, so that it can be mixed with uninhibited acid such as hydrochloric acid, by the user. The amount of inhibitor is generally about 0.1% to about 1% by weight of anhydrous acid.

The alphachrome removal of the present invention can be used to reduce or eliminate the alphachrome content of the airfoil portion of the blades produced in Example 8, but because the alphachrome content of the airfoils is much greater than that of the roots, the alkaline permanganate treatment takes several times as long, even when conducted in stages. In general it is preferred to remove no more than about 5 milligrams of chromium per square centimeter of surface by this treatment.

Other jet engine turbine parts such as vanes can also be given the treatment of Example 8. Such vanes have buttresses, which like the roots of blades, are mounting portions preferably free of alphachrome while their airfoils are improved by an aluminized alphachrome that leaves the alphachrome in separated islands.

The coating technique of Example 8 is particularly desirable and when used to form chromized cases by a gas-phase chromizing as there shown for the blade roots, provides such cases with a minimum of alphachrome phase. Where such case is formed with a maximum chromium content of about 30% or less, no alphachrome phase at all can generally be detected and no alphachrome removal step is needed. Combining the gas-phase coating with the pack coating as in Example 8, makes it unnecessary to provide separate supports for holding the workpieces exposes to the gas-phase.

In general the chromizing mixture 14 for the gas-phase coating can have as little as 2% and as much as 80% chromium, preferably 5 to 80%, and other inert diluents like fired kaolin can be used in addition to or in place of the alumina. The heavy chromizing pack 22 should have at least about 2% aluminum to minimize the formation of oxide inclusions, but its nickel content can be reduced to about the same level as the aluminum content. Its chromium content should be at least about 40%, preferably at least 60%, of the total of all its metallic ingredients, and the aluminum content should be not more than one-fifth, preferably not more than one-ninth, the chromium content. Other activators such as ammonium bromide, elemental iodine and ammonium bifluoride can be used.

There should be sufficient inert diluent, for instance at least about 25% by weight, in the pack 22 as well as in mixture 14, to keep the metal particles in them from sintering together or to the workpiece, tube or retort. It is also helpful to have pack 22 of such non-fluent nature that the packed tubes 20 can be placed on and removed from mixture 14 without having any material amount of that pack fall into that mixture and thus contaminate it. By avoiding such contamination, both the pack 22 and the mixture 14 can be reused. Mixture 14 can be made more fluent as by using a fluent form of alumina for its inert ingredient. Tabular alumina powder having particles about 100 to 300 microns in size are suitable for this purpose.

The retort 10 and tubes 20 become fairly heavily chromized after a few runs, so that there is no need to make them of anything more expansive than inexpensive stainless steel.

The process of Example 8 can be used with other nickel-base superalloys such as U-500, IN-738, IN-713 or U-700, as well as with cobalt-base superalloys including WI-52, Mar-M 509, PWA 657 and X-40, to prepare a chromized, or a chromized then aluminized, product. If desired the chromizing can be uniformly applied over the entire workpiece either by the gas phase arrangement omitting pack 22, or by pack diffusion in which event the entire workpiece is imbedded in the pack with or without the help of tubes 20. The gas phase treatment applies less chromium as well as very little or no alphachrome, and does not increase the workpiece dimensions very much. When it applies a chromized case about 0.7 mil thick, about one-third that case thickness is thickness that adds to the original workpiece dimension. The remainder of the case thickness represents the original surface of the workpiece.

Masking of chromium-nickel-iron type stainless steels during chromizing is best effected by imbedding in compacted powder the metalic portion of which is 13 to 20 weight % chromium, 6 to 10 weight % nickel, and the balance iron, and is diluted with 1 to 2 parts by weight of $Al_2O_3$. The powder is broken in by a pre-firing. When the chromium content of the metallic portion is above about 17 weight percent, a slight chromizing can be effected right through a layer of masking powder as much as two inches thick. Such chromizing is not necessarily undesirable inasmuch as it assures that chromium has not been depleted from the substrate being masked. By avoiding depletion, the masked surface remains ductile, strong and with a somewhat enhanced corrosion resistance.

Where embedment is impractical for the masking, then masking layers can be applied from slurries in volatile solvents as described above. However a ⅛ inch layer so applied is not suitable by itself and is not compact enough to prevent major chromizing. Application over such a coating, of a second layer containing a major amount of iron powder with or without refractory diluent will effectively prevent passage of chromizing vapor to the substrate and also forms a protective sheath. A small content of chromium, about 5 weight % of the total metal content can be added to the second layer, to help assure that there is no excessive depletion of chromium from the first layer and from the substrate.

The alphachrome-removal treatment described above can be effected on chromized cases regardless of how these cases are produced. It extracts alphachrome chromium, but does not appear to attack other phases in the chromized case, so that the total chromium loss caused by this treatment is very small.

Hollow engine vanes or other types of hollow workpieces can also be diffusion coated in accordance with Example 8, and if the hollow interior opens on its exterior, some coating will also form in that interior. Where the internal surface of a hollow workpiece does not require heavy case formation the hollow interior need not be packed with a diffusion-coating pack but can merely be left in communication with the gas space in the retort. To improve the gas phase chromizing of such interiors without complicating the operation unduly, the interior can be coated with a uniform layer of chromium particles as described in application Ser. No. 230,333. Alternatively, the retort can be equipped with a gas circulator such as the rotor of U.S. Pat. No. 3,353,936 to propel the retort gas through the workpiece interior during the chromizing operation. A series of hollow vanes can thus be disposed around the periphery of such rotor, each vane having the passageway to its interior located close to the rotor margin and oriented to directly receive gas propelled by the rotor.

The diffusion-coating powder mixture used with the gas phase chromizing need not cover the retort floor but can leave a portion of the floor bare to receive workpieces and/or the rotor. Indeed the diffusion-coating powder mixture can be held entirely off the floor, in baskets for example as in U.S. Pat. No. 3,353,936.

It is generally awkward to make ferrous metal surfaces scrupulously clean. The awkwardness principally involves the formation of smut on the ferrous surface, particularly if it has been subjected to an electrolytic or acid treatment. The smut is probably the residue of some of the resistant constituents of the ferrous metal left behind when the surface of the metal is attacked, and the best technique for removing the smut has been mechanical brushing. Because brushes so used tend to wear out fairly rapidly, the operation of fast-moving production cleaning lines that include brushing is difficult to make completely automatic.

According to another aspect of the present invention the brushing off of the smut is replaced by the steps of depositing on the smutty surface a flash coating of nickel and then subjecting the thus-coated surface to the action of aqueous nitric acid containing a little halide such as $Cl^-$. This rapidly dissolves the nickel coating and also removes the smut. This is exemplified as follows.

EXAMPLE 9

A coil of two mil thick SAE 1010 steel foil is passed through a series of tanks in which it is treated in the following sequence of steps each taking about 1/6 minute:
- (a) Alternating current (60 Hertz) electrolytic action as a bipolar electrode at 50 amperes per square foot in an aqueous solution containing 5% NaOH and 5% sodium silicate and held at 150° F.
- (b) Reciprocal bipolar electrode electrolytic action at the same current density and in the same bath as in step (a).
- (c) Rinse in tap water.
- (d) Dip in 1% by weight aqueous inhibited hydrochloric acid.
- (e) Rinse in tap water.
- (f) Passage through a nickel flash plating bath in which it is cathodically treated for three minutes at a current density of 20 amperes per square foot. The bath is an aqueous solution of 213 grams $NiCl_2.6H_2O$ and 35 cc. 20% aqueous HCl, in 500 ml. water and is held at about 70° to 100° F.
- (g) Rinse in tap water.
- (h) Dip in 20% by weight aqueous nitric acid containing 0.1% by weight hydrochloric acid.
- (i) Rinse in tap water.

After emerging from the final rinse the foil is clean and no smut is detectable. It can now be loosely coiled as described in U.S. Pat. No. 3,222,212 for diffusion coating, or given any other kind of coating.

The nickel flash can be deposited from acid or alkaline plating baths and need only weigh about 0.05 milligram per square centimeter. Greater coating weights do not help the smut removal significantly and coating weights over about 0.3 milligram per square centimeter generally take too long to apply and are too expensive. An electroless nickel flash can be used but it is not as effective.

The smut removal of the present invention can be effected on high-carbon steels as well as on alloy steels including stainless steels and does a very good job on flat or curved surfaces. Surfaces that are too concave or convex should be plated with the help of anodes so shaped and located that a fairly uniform flash coat is deposited, in order to make sure the flash is deposited all over the surface in the least time.

The nitric acid content of the flash-removing solution can range from about ½% to about 40% by weight, and should contain about 20 to about 200 times as much nitric acid as halide ion. While hydrogen chloride is a very convenient source of halide ion, and chloride, bromide, iodide or fluoride that dissolves and dissociates in the nitric acid solution, sodium or calcium chlorides for instance, are suitable sources.

The desmutting technique of the present invention is particularly desirable for use on surfaces that are not flat, or are not readily accessible for mechanical scrubbing. Thus an expensive sand-blasting operation is eliminated in the preparation of AN 355 jet engine blades for diffusion aluminizing and top coating by the process described in U.S. Pat. Nos. 3,948,689 and 4,241,147. Such blades are very effectively given the following sequence of treatments.

EXAMPLE 10

The blades are subjected to steps (a), (b) and (c) of Example 9, followed by ultrasonic treatment at about 50,000 Hertz in tap water for one minute. They are then dipped in ½% by weight aqueous uninhibited hydrochloric acid, followed by the flash coating of step (f) in Example 9, but with only 30 seconds of cathodic action at 40 amperes per square foot. This is then followed by another rinse in tap water and a strip in 15% by weight aqueous nitric acid containing 0.15% sodium chloride, another tap water rinse, a repeat of the foregoing ultrasonic treatment and another nickel flash coating. This flash coating is applied for two minutes at 40 amperes per square foot using the same nickel plating bath. The resulting flash-coated blade is rinsed in tap water, permitted to dry and packed in the aluminum diffusion coating pack of Example 1 in U.S. Pat. No. 4,241,147, and subjected to the diffusion coating there described. After the aluminizing the blades are removed from the pack, washed with tap water, and given the top coating of Example II of U.S. Pat. No. 3,948,689.

The resulting blade has a very smooth surface and a long life in a jet engine compressor.

The nitric acid strip solution should not be kept in contact with the ferrous surface for more than a few seconds after the flash is removed. While nitric acid tends to passivate ferrous surfaces, particularly when this acid is in a high concentration, the passivating action cannot be depended upon to persist very long when the metal is being manipulated.

The parent applications refer to the preparation of active metal surfaces by diffusion coating a metal such as nickel, platinum, iron or the like, and then dissolving out the material introduced by the diffusion.

Palladium is best catalytically activated with zinc. A simple diffusion of about 1 to 30 milligrams of zinc per square centimeter of palladium surface, followed by leaching with strong, at least 10%, HCl in water at 95° C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% $NH_4Cl$, and heating for 4 hours at 600° F. in a hydrogen-bathed atmosphere. This effects a zinc pick-up of 4 mg/cm², essentially all of which is leached out by 20% HCl in 10 minutes. The resulting screen is pyrophoric when exposed to air.

Zinc can be similarly diffused into titanium foil in a hydrogen-bathed atmosphere from such a zinc-containing pack. As an example a 4 mil thick titanium foil is embedded in a pack having the following composition:

| | |
|---|---|
| 80 g | Zn |
| 16 g | Al |
| 305 g | $Al_2O_3$ |
| 4 g | $AlCl_3$ | and subject to 10 hours of diffusion at 950° to 1000° F. The foil picks up about 3.5 milligrams of zinc per square centimeter. It is worthy of note that the titanium does not become seriously embrittled by such treatment, and can be bent around a ⅛-inch radius without cracking. The diffused-in zinc can be leached out with 20% boiling NaOH solution to leave a very active catalytic surface. Titanium activated this way can be used as a conventional electrolysis electrode, or as a substrate for the photosensitive electrodes described in the Augustynski et al paper in the Journal of the Electrochemical Society, Volume 124, No. 7, pages 1063–64 (1977).

For some purposes, such as catalytic alkylation, it is helpful to have a catalytic tin surface. Inasmuch as tin is a very low melting metal, it is helpful to first diffuse the tin into a high-melting support such as nickel. By way of example an 80-mesh nickel gauze made of 4 mil thick wire, is embedded in the following pack:

| | |
|---|---|
| Tin powder | 73 grams |
| Nickel powder | 27 grams |
| Alumina | 300 grams |
| $NH_4Cl$ | 4 grams | which pack had been pre-fired at 1000° F. for 5 hours and then had its $NH_4Cl$ content replenished. Diffusion is conducted in hydrogen at 1400° F. for 5 hours to give a 20 milligram per square centimeter pick-up. The resulting tin-containing gauze after removal from the pack, is subjected to post diffusion by heating in hydrogen at 1600° to 1700° F. for 5 hours to leave the diffusion case about 1.3 mils thick. This product is now activated by a pack diffusion at 850° to 900° F. for 30 hours using a pack having 20% powdered aluminum, 80% powdered alumina, and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1 mil thick layer of copper on a 1 mil thick palladium foil, heating the copper-palladium combination in hydrogen at 1050°–1100° F. for 12 hours to diffuse the copper deeply into the palladium, and then diffusion coating the resulting product under hydrogen in a pack containing 10% zinc, 90% alumina, and activated with ½% $NH_4Cl$. Ten hours of such treatment at 660°–690° F. produces a pick-up of about 7 milligrams of zinc per square centimeter of foil surface and a 0.7 mil thick case the surface stratum of which contains about 25% zinc. The final step in the activation is a leaching in 30% HCl for 3 minutes at about room temperature followed by 10 minutes more at about 212° F. in 15% HCl.

The pack diffusion to activate the catalyst can be effected in one step or in multiple diffusion steps under different diffusion conditions to vary the distribution of the diffused-in metal. Regardless of how the diffusion is carried out, the catalytic activity of the leached product can be entirely blocked by immersing the activated surface in an aqueous solution of a chromate such as an alkali metal, magnesium or ammonium chromate or chromic acid. A concentration of about 1% chromate ion is all that is needed to inhibit essentially all the catalytic activity of nickel or platinum for example, after only a few seconds contact. Smaller concentrations, as low as 0.1% chromate ion, will also be effective if kept in contact for longer times.

A catalyst so inhibited can be conveniently stored or shipped without being immersed in a protective liquid. Moreover the catalyst can subsequently be reactivated by merely treating it for about 2 minutes with 5% aqueous NaOH, preferably at 90° C. Rinsing away this treating liquid will then leave the catalyst with almost all of its original activity.

A highly pyrophoric nickel screen subjected to evacuation at about 10 millimeters or less of mercury, will still be catalytic. The evacuation takes a minute or more, indicating that hydrogen had been absorbed on the surface and was being removed by the evacuation.

Activated nickel surfaces can be modified by dipping for a few seconds in aqueous hydrogen peroxide. A three volume percent $H_2O_2$ solution modifies the surface and turns it black so that it is no longer pyrophoric. The modified surface is however still catalytic and will for example show a strong decrease in overvoltage when used as a cathode or anode in electrolyzing aqueous NaOH to generate gas. The activation of platinum or its alloys can be similarly modified by immersion in aqueous $H_2O_2$ or in aqueous HCl at least 20% strong.

A pyrophoric activated surface will retain its pyrophoricity for some time if kept covered by an inert fluid —even argon gas—or by a dried film of caustic soda or sodium silicate. Such drying is best conducted in an inert atmosphere. The pyrophoricity is enhanced by applying to the surface a pervious layer of material that accentuates heat generation. Thus a pyrophoric nickel screen can be momentarily dipped into a 1% solution of picric acid in water, and then dried in argon. Upon subsequent exposure to air it generates much more heat than a correspondingly activated nickel not dipped in the solution.

The foregoing intensifying effect is obtained with other heat-triggered materials such as trinitro toluene, ammonium nitrite, ammonium nitrate and triethanolamine. For intensification the triethanolamine layer should weigh less than one milligram per square centimeter, at least in spots. Intensification is also obtained with surfaces that before intensification show only a relatively low degree of pyrophoricity—such as a temperature rise of only about 50° F.

Inert fluids used to cover and preserve the pyrophoric surface are those that are inert to active hydrogen and nickel. Thus saturated hydrocarbon liquids like cyclohexane, n-heptane, any of the nonane isomers, triethanolamine, kerosene and melted wax make very effective preserving films, and if they are kept from evaporating off as by sealing such a filmed pyrophoric nickel in an argon atmosphere, will preserve the pyrophoricity for months. Methyl ethyl ketone can also be used this way as a preserving film inasmuch as it is sufficiently inert.

Readily vaporizable preserving films, such as those having boiling points below about 125° C. also have the advantage of permitting pyrophoric actions to develop by merely exposing the filmed surface to the open air so that the film evaporates within 1 to 2 minutes.

The presence of a liquid saturated hydrocarbon film preserves the pyrophoricity better than the mere sealing in an inert gas without such film. Preservation of pyrophoricity can also be accomplished by maintaining a blanket or atmosphere of hydrogen around the activated metal.

The pyrophoric action can also be used to ignite materials that then burn to deliver very large quantities of heat. Thus magnesium ribbon about 4 mils thick can be rolled against a pyrophoric nickel foil that is protected by any of the above-noted coatings, the rolling being effected under a pressure great enough to cause the ribbon to adhere to the foil. A force of 500 lbs. for example applied to such a ribbon by the semicylindrical nose of an anvil in which the cylindrical radius is ⅛ inch and the cylinder length ¾ inch, while the foil is backed up by a flat support, will cause the ribbon to adhere to the foil along a thin line corresponding to the peak of the semicylindrical nose, if the force is maintained for about 10 seconds.

The presence of a protective layer such as triethanolamine on the foil does not prevent such adhesion. A magnesium ribbon about ¼ inch wide secured this way will be ignited when the protective layer is washed off and the washed foil dries out and becomes pyrophoric. The ignition of the ribbon generally starts at one point and the ribbon then burns along its length becoming incandescent, very much like an unsupported magnesium ribbon burns. A clean titanium foil can also be ignited this way.

Holding a fine-wire thermocouple against the surface of the nickel foil while it becomes pyrophoric (without any pyrophoricity-increasing material on it) indicates the surface reaches a peak temperature of about 1600° F. If some triethanolamine or picric acid is on that surface in an amount that does not prevent the development of pyrophoricity, the thermocouple indicates peak temperatures as high as 1700° F. or even higher.

A pyrophoric iron foil prepared like a pyrophoric nickel foil shows somewhat lower peak surface temperatures—generally about 800° F. to 1200° F.—but takes a longer time to cool down. This apparent inconsistency may be due to a difference in the type of chemical change accompanying the pyrophoric action. It appears the nickel surface becomes converted to NiO, and the iron surface to $Fe_2O_3$ and/or $Fe_3O_4$ either of which conversions call for more heat liberation than the conversion of Ni to NiO. The iron conversion might also be effected in stages so that heat is generated in stages and the heat generated by the first stage is partly dissipated before the next heat generation stage.

It is preferred to leach the aluminized iron under relatively mild conditions, as by using 17% NaOH in water at 85°–100° F. for 30 minutes or 10% NaOH in water at 140°–160° F. for 15 to 20 minutes. More vigorous leaching leaves the iron with reduced pyrophoricity and also seems to cause some of the surface iron to slough off.

A very effective magnesium flare can be made by intimately adhering a pyrophoric strip of metal to a magnesium ribbon so as to cause the metal to become pyrophoric when exposed to air and to then ignite the magnesium. The pyrophoric strip can be larger or smaller than the magnesium ribbon. The length of the ribbon will generally determine the burning time, and the pyrophoric strip need be no lrger than is sufficient to insure the ignition of the ribbon. Two or more pyrophoric strips can be adhered to different portions of a ribbon to help assure that it becomes ignited or to start it burning at different locations.

A half-minute flare con consist of a six inch length of magnesium ribbon about 3 mils thick and ¼ inch wide, with a one-inch by half-inch strip of pyrophoric nickel foil rolled onto one end. The combination has a low density and when dropped from an airplane will ignite and fall like a leaf at a relatively slow rate. Making the ribbon thinner and wide further reduces the rate of fall, so that a parachute is not needed to slow its descent. To prevent premature ignition the pyrophoric strip can have its surface protected against premature exposure to air, as by packing it under a protective atmosphere or a protective liquid, in an air-tight container. The protective atmosphere can be nitrogen, argon or hydrogen for example, and the protective liquid can be a readily evaporated one such as water, methanol or nonane.

A number of such magnesium flares can be packed into a single small container fitted like a shot-gun shell with a small propellant charge sufficient to expel the flares when fired from a shot-gun breech. Alternatively they can be packed in a container having a readily torn-off tear strip that opens the container when torn off and permits the flares to be ejected by whirling the open container to apply centrifugal force to the flares inside. If desired the container can be made of combustible material like paper that is itself ignited and consumed by a burning flare. The paper of such a container can be impregnated with wax or the like to make it gas-tight. A small amount of explosive can also be packed in the container to be detonated by the ignition of a flare and thus expel the flares and/or fragment the container.

The foil need not be a pure metal, but can be an alloy such as an alloy containing chromium or copper, and/or can have a laminated construction. An iron foil can for example be plated with a very thin layer, about 0.1 to 0.5 mil thick, of nickel on one or both surfaces. On the other hand a suitable foil can be made of an alloy of iron and nickel containing 1% to 99% of either metal. A little carbon dispersed in or alloyed with the metal, even 0.1 to 1% is helpful, as is a small content of other ingredients such as magnesium that are easily ignited.

The pyrophoric metal web can be in the form of a screen. Thus a 100 mesh screen of 10 mil thick nickel wire can have 38 milligrams of aluminum diffused into it, which after 1 to 1½ hours leaching with boiling 20% NaOH in water, becomes highly pyrophoric and merely left to dry will undergo a violent explosion.

A readily ignited metal such as titanium or magnesium in foil or wire form can also be given a nickel coating, as by rolling, and the nickel coating then rendered pyrophoric. To ignite the ignitable metal the coating should be at least about 0.4 mil thick.

The pyrophoric metals, regardless of how they are produced, can be plated as by electrolytic coatings from alkaline cyanide baths, of zinc, cadmium, silver, tin or copper without significantly diminishing their pyrophoricity. Such coatings that are over about 0.2 mil thick will significantly reduce the pyrophoric action.

Techniques for preparing and using pyrophoric metals are described in parent application Ser. No. 281,405, and the contents of that application are hereby incorporated herein as though fully set forth. As there noted, powdered materials can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by aluminizing an iron foil completely through its thickness and grinding the foil to a powder and then leaching the powder with aqueous NaOH. Raney iron can also be used. Activated nickel powder can be prepared the same way but it is preferred to use Raney nickel powder or to leach powdered $NiAl_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particles size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅓ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The magnesium-containing mixtures of the present invention, and particularly the iron-magnesium-containing mixtures may be used for the purposes described in U.S. Pat. No. 4,264,362.

The continuous diffusion processes of Ser. No. 281,405 as well as of parent application Ser. No. 172,671, provide a speedier diffusion coating than conventional batch processes. It appears that in such continuous diffusion, activator is continually being added to the diffusion coating retort so that the activator is somewhat more effective. As a result the diffusion-coating time and/or temperature needed, is lower than normal.

Thus only about 15 minutes at 1600° F. will yield an aluminized diffusion case 1 mil thick on a steel foil, using a diffusion-coating powder containing only ½% $NH_4Cl$ activator. Such a diffusion case, when leached with caustic soda for 30 minutes, leaves the substrate foil highly pyrophoric.

Batch treatment of short lengths of foil in individual retorts, as in U.S. Pat. No. 3,824,122 but with the individual retorts loosely covered, requires a 1650° F. diffusion temperature to obtain comparable results.

The activator greatly speeds the transfer of diffusion-coating metal from the diffusion-coating powder to the surface of the substrate being coated. In a conventional commercial batch operation the activator is vaporized and driven out of the diffusion-coating retort as the retort heats up, so that the activator remaining at the end of the heat is at an extremely low concentration. The continuous addition of activator as in the continuous process of the present invention accordingly yields a case with its outer surface somewhat richer in diffusing metal.

Increasing the content of activator in a conventional batch process has a similar effect, but is not as marked.

When diffusion coating a continuous substrate less than about five mils thick, the heat conducted away by such thin material is almost insignificant, so that the heating up and the cooling down can readily be accomplished in seconds.

The foregoing improvements in diffusion speed are also obtained with other diffusing-in metals such as chromium, zinc and nickel, and with vaporizable activators of any kind including the ammonium halides and aluminum chloride, bromide and iodide.

Pyrophoric particles can also be obtained by leaching alloy particles prepared by diffusion coating as in Canadian Pat. No. 603,191 or alloying iron or nickel powder or other similar powders. Thus iron or nickel or cobalt powder is readily diffusion aluminized in a diffusion coating retort in which such powder and aluminum powder are heated to diffusion coating temperature, preferably in contact with a vaporized diffusion coating activator. This is illustrated in the following Example:

EXAMPLE 11

40 grams minus 325 mesh iron powder are mixed with 60 grams similarly sized aluminum powder and 1 gram anhydrous aluminum chloride powder, and the mixture placed in a steel retort, the retort loosely covered and placed in a larger retort through which a stream of argon flushes. The retort assembly is then inserted in a furnace, heated to 1200° F. and kept there for 1½ hours. During the initial heat-up, a stream of hydrogen is substituted for the stream of argon. After cooldown the powder particles have sintered together to a large degree, and the resulting masses are ground, as with a chopper blade such as used in a micro-mill type grinder, to very fine particle size, for example 325 mesh. These particles can be screened out, if desired and constitute particles that can be somewhat larger in size than the original particles. These aluminized particles can now be subjected to a caustic leach treatment to produce highly pyrophoric iron powder the particles of which are about the same overall size as the aluminized particles. The grinding can be controlled to provide activated particles of larger or smaller size.

To reduce the tendency for the particles to sinter together during the diffusion coating, the diffusion temperature and/or time can be lowered to as low as about 800° F. to 900° F. and/or inert refractory particles such as alumina powder can be mixed with the iron and aluminum powders. After such a mixture has completed its diffusion coating treatment or the leaching treatment, the inert alumina can be separated out magnetically. The leached iron particles are magnetic whereas the alumina particles are non-magnetic so that pouring a stream of the mixtures through a magnetic field causes the iron particles to be deflected away from the alumina particles. There may be some tendency for fine alumina or other refractory particles to physically adhere to the diffusion-coated iron particles, in which event the diffusion-coated mixture can be forcefully agitated in water preferably containing a little surface active agent to wash the fine alumina or the like off the heavier iron particles and permit those heavier particles to settle out.

Powdered pyrophoric metal or powdered precursor alloys can also be separated from inert diluents or other ingredients in diffusion coating packs by having different sizes for the particles to be separated and sieving the mixture to effect the separation. Thus cobalt balls at least about 20 mils in diameter can be diffusion coated in a pack whose particles are all smaller than 2 mils thick. Such diffusion coating can be for purposes other than the preparation of pyrophoric articles, and is suitable for chromizing, tantalizing, boronizing, nickelizing etc. Cobalt balls that are first chromized and then aluminized by powder packs as described in column 3 of U.S. Pat. No. 4,041,196, are highly suited for the flue treatment described in U.S. Pat. No. 4,254,616.

When substantial quantities of iron and aluminum powders are mixed and heated, they react with each other when the temperature reaches about 900° F., and generate large quantities of heat while very rapidly forming the aluminide. Thus for continuous formation of aluminide powders, iron or nickel powders or mixtures of the two can be further mixed with the aluminum powder and then poured onto a moving conveyor of Inconel 600 for example that carries the resulting mixture though an aluminizing atomsphere where the leading edge of the mixture is heated as by a burner or oven to initiate the reaction. When the reaction starts the burner can be turned off, and when an oven is used the oven can be temperature-controlled to reduce or cut off the heat it supplies, when the reaction supplies sufficient heat.

Where the case to be formed by the diffusion coating is very thin, the diffusion coating pack can contain only enough coating metal to form the desired case thickness, so that the coating metal is entirely or substantially entirely depleted by the time the diffusion coating step is completed. This makes it a little easier to effect the separation of the coated substrate particles.

The substrate particles can also have a substantially higher density than the pack particles so that the final separation of coated substrate is by density difference, such as by stratification with a liquid of intermediate density or by causing a stream of the pack powder, after the coating completion, to fall through a transversely blowing stream of air. The transversely moving air carries the less dense particles to one side much further than the denser particles. Such a separating technique is particularly desirable with low temperature aluminizing, because the aluminum powder then remaining in the coating pack has a density much lower than most substrate metals.

The ignition temperatures referred to above are the lowest temperatures at which the metals there discussed ignite in air. Pyrophoric metals react and ignite at extremely low temperatures and are accordingly not considered as having an ignition temperature. When an ignition temperature is mentioned, it is accordingly in connection with a material that is not pyrophoric. Carbon and boron, both of which are ignited by the pyrophoric metals, can be considered ignitable metals for the above purposes.

Finely divided pyrophoric nickel can be prepared by substituting nickel powder for the iron powder of Example 11.

The treatments described above for increasing or tempering the pyrophoric effects of pyrophorically-activated surfaces are applicable to those surfaces whether they are activated or treated by a continuous process or by a batch process. Examples of some desirable batch processes include the open-coil treatment described in U.S. Pat. No. 4,349,612.

The pyrophoric surfaces of the present invention are also catalytic, and this catalytic characteristic is not destroyed if the pyrophoricity is diminished or even completely eliminated. Thus treatment of these pyrophoric surfaces with 3% aqueous $H_2O_2$ will eliminate all pyrophoricity but the resulting surfaces are still highly catalytic. Indeed such catalytic function is particularly desirable for use under conditions in which they are subjected to a reducing rather than oxidizing environment. Nickel cathode electrodes prepared that way are thus very long-lived over-voltage diminishers, and platinum or platinum-5% rhodium screens are long-lived high temperature catalysts for HCN synthesis. It appears that some activating metal such as aluminum is still present in these catalytic surfaces and at high temperature conditions this residual metal causes changes that alter the catalytic nature. Vigorous anodic treatment in aqueous caustic removes much of this residual metal.

The pyrophoric particles as well as the pyrophoric foils, can be used to generate a hot cloud, as for example to decoy heat-seeking missiles. Thus the pyrophoric particles produced according to Example 11 can be rinsed with water, then with acetone, and packed under argon in a simple container or in spray can, and about 100 grams of such powder projected into the air. These particles promptly heat up and oxidize, and the resulting cloud of particles rises as a result of the heating. It is only after several minutes that the oxidized particles settle down to the ground.

A hot cloud of rising particles is also produced with pyrophoric iron-aluminum alloy particles obtained by leaching powdered $FeAl_2$ or $FeAl_3$, both of which are available commercially as powdered Raney metal. Such commercial powders are obtained by grinding a solidified melt of iron and aluminum having these metals in the desired proportions. Powders with particles sized to pass 100 or 250 mesh are thus available, and if desired they can be ground down to particle sizes of less than 60 microns or even less than 30 microns. Grinding them down to about 10 microns does not seem to be worth the effort.

Modifying Example 11 by using particle sizes of about 30 to 100 microns for the iron powder and for the aluminum powder, and reducing the diffusion time to 1 hour after it reaches 900° F., yields iron-aluminum alloy particles that are not heavily sintered together and a light crushing in a mortar and pestle yields a powder that can be somewhat coarser. A one hour leaching of that powder in 17% aqueous NaOH by weight while keeping the leaching temperature no higher than 110° F., leaves a pyrophoric powder that when discharged produces a hot cloud that does not rise much before eventually settling out.

An alloy in which before leaching the aluminum content is at least about 40% by weight should be used to make the desired cloud, but an aluminum content of at least about 50% by weight is preferred. The desired leaching should not be too vigorous, and about 200° F. is too high a temperature to produce high pyrophoricity. Aqueous caustic soda having a 4% strength by weight is preferably used at temperatures no greater than about 160° F., and higher strengths at lower temperatures, with 40 weight percent used at temperatures no greater than about 110° F. Cooling of the leaching reaction may be required, depending on the quantity of reactants and the volume of the latch solution. Because of the fineness of the particles, the entire leaching step takes about one hour or less. Caustic potash can be used in place of the caustic soda, under the same conditions.

The foregoing leaching leaves the leached particles with only a small aluminum content and highly pyrophoric. More vigorous leaching leaves a smaller aluminum content in the leached particles, but appears to attack the active iron sites and also leaves them somewhat less pyrophoric and less effective.

Pyrophoricity is readily measured by exposing a 25 to 35 milligram sample of the activated powder to air and using a two mil platinum-platinum/rhodium wire thermocouple to measure the temperature rise during the exposure. A temperature of 600° F. should be reached, but preferred temperatures are as high as 1100° F. or higher.

Substituting nickel for the iron in the diffusion coated particles, or using commercial Raney nickel powder, gives somewhat better results in producing a rising cloud of pyrophorically heated particles. This nickel-aluminum alloys containing as little as about 35% aluminum before leaching, can be very effectively used.

Where the pyrophoric particles before leaching are made by diffusing aluminum into iron or nickel, it is important to conduct the diffusion operation at relatively low temperatures, such as below 1200° F. and preferably below 100° F. Even at temperatures as low as 850° F., the time at temperature can be as short as about 45 minutes when a diffusion activator such as $AlCl_3$ is used.

The alloy particles can also contain other ingredients such as boron, titanium, carbon, zirconium and magnesium, that help generate heat. Excluding the aluminum, the content of pyrophoric metal in the leached alloy should be at least about half, by weight, in order to have enough pyrophoricity to cause the remaining ingredients to react and generate their reaction heat.

The pyrophoric reaction can be stretched out by interfering with the access of oxygen to the pyrophoric surface. Thus light coatings of colloidal silica or alumina as described in U.S. Pat. No. 4,349,612 can be applied to the particles. Also leaching in caustic that contains sodium or potassium silicate leaves a residual silicate film if rinsing is incomplete or by rinsing thoroughly and then dipping in a dilute solution of silicate preferably having a 3 to 5 $SiO_2$ to 1 $Na_2O$ ratio.

The pyrophoric particles used to make the hot cloud can be mixed with other materials that increase or decrease the heat generation and/or vertical cloud movement. Thus the activity of the pyrophoric particles can be reduced as by too vigorous leaching or by particularly light leaching, and the sizes of the pyrophoric particles can be increased to 100 or more microns to keep them from rising much in the hot cloud. Alloying the particles with other ingredients such as silicon or chromium that are not rendered pyrophoric, also reduces the upward movement of the cloud they generate after activation.

Alternatively the pyrophoric particles can be mixed with non-pyrophoric particles such as unactivated iron powder or carbon powder which act as diluents.

On the other hand the pyrophoric particles can be packed wet with a voltile combustible liquid like n-heptane which quickly evaporates when the particle pack is discharged, and is then ignited when the dried particles pyrophorically heat up. Other materials such as strong aqueous solutions of ammonium nitrite inflame when in contact with the cloud-forming particles, and particles wet with such solutions will immediately react with the air even before the solution solvent evaporates. Such ammonium nitrite solutions should have a concentration of at least about 5% by weight, preferably at least about 10% by weight, and should not be in contact with the pyrophoric particles for more than 5 minutes, preferably no more than about 2 minutes, before the particles are discharged into the air.

The pyrophoric particles are conveniently discharged to form the desired cloud, by loading them in a shot-gun shell in place of the shot and the propellant gun-powder. A relatively short 12 gauge paper shell can thus be packed with about 50 grams of the powder sealed airtight in a plastic enclosure around which the shell is crimped. The usual primer charge will be enough, when detonated, to expel the powder and create the desired cloud.

Larger quantites, up to a pound or more, can be poured into a valved pressure-resistant container which is then pressurized to about 200 to 600 pounds per square inch gauge with argon, and upon opening the valve the powder contents are propelled out with the argon.

Obviously many modifications and variations of the present invention are possible in the light of the above teachings. It is, therefore, to be understood that within the scope of the appended claims the invention may be practiced otherwise than as specifically described.

What is claimed:

1. A solution in which heavy metal particles are readily suspended, the solvent of said solution comprising methyl chloroform or methylene chloride, and in the solvent are dissolved from about 2 to about 8% acrylic resin binder and from about 0.1 to about 1% of an ethylene acrylic acid copolymer dispersing aid having a hydrocarbon chain of from 12 to 50 carbons.

2. The solution of claim 1 in which there is also dissolved in the solvent about 0.1% of a low-foaming nonionic surface-active agent.

* * * * *